United States Patent [19]

Kawashima

[11] 4,178,527
[45] Dec. 11, 1979

[54] QUARTZ CRYSTAL TUNING FORK VIBRATOR WITH UNEXCITED TINE CENTERS FOR REDUCED FLEXURAL AMPLITUDES

[75] Inventor: Hirofumi Kawashima, Tokyo, Japan

[73] Assignee: Kabushiki Kaisha Daini Seikosha, Japan

[21] Appl. No.: 856,756

[22] Filed: Dec. 1, 1977

Related U.S. Application Data

[63] Continuation-in-part of Ser. No. 844,827, Oct. 25, 1977, abandoned.

[30] Foreign Application Priority Data

Oct. 22, 1976 [JP] Japan .................................. 51-126878
Mar. 22, 1977 [JP] Japan .................................. 52-31422

[51] Int. Cl.² ............................................ H01L 41/10
[52] U.S. Cl. ..................................... 310/370; 310/366
[58] Field of Search .................................. 310/366, 370

[56] References Cited

U.S. PATENT DOCUMENTS 2,185,599   1/1940   Mason ............................. 310/370 X
3,944,862   3/1976   Shimoi et al. .................... 310/370 X
3,969,641   7/1976   Oguchi et al. .................... 310/370 X
4,099,078   7/1978   Shibata et al. ................... 310/370 X Primary Examiner—Mark O. Budd
Attorney, Agent, or Firm—Robert E. Burns; Emmanuel J. Lobato; Bruce L. Adams

[57] ABSTRACT

A quartz crystal tuning fork vibrator comprises a monolithic quartz crystal vibrator having a tuning fork shape with a plurality of vibratable tines. A set of electrodes are adhered to opposite surfaces of the tuning fork vibrator and are arranged in such a manner that when suitable alternating voltage is applied thereto, the tines undergo flexural vibration in their fundamental or resonance mode. The electrodes on each tine surface are preferably arranged in groups of four with the center two being applied with voltage of one polarity when the outer two are applied with voltage of the other polarity thereby establishing electric fields within the tines at the outside portions thereof while no electric field is established at the center portion of the tines. All of the flexural strain is thus confined to the outside portions of the tines thereby lowering the amplitude of vibration of the tine ends to the order of $5\mu$-$10\mu$.

18 Claims, 15 Drawing Figures

QUARTZ CRYSTAL TUNING FORK VIBRATOR WITH UNEXCITED TINE CENTERS FOR REDUCED FLEXURAL AMPLITUDES

This application is a continuation-in-part of Sn 844,827 filed Oct. 25, 1977 now abandoned.

BACKGROUND OF THE INVENTION

The present invention relates to quartz crystal vibrators and more particularly, to quartz crystal tuning fork vibrators.

Quartz crystal tuning fork vibrators are in widespread use today in various applications and because of their relatively low resonance frequency and stability of performance, such vibrators are particularly suitable for use in watches and other timepieces. The techniques currently used to manufacture the quartz crystal tuning fork vibrators are similar to those used to manufacture electronic integrated circuits and in general, such techniques comprise a combination of mechanical working steps and etching steps.

One drawback of these techniques is that the resultant tuning fork vibrator requires a large amount of frequency adjustment before it can be embodied in a timepiece. It is very difficult to mass-produce quartz crystal tuning fork vibrators having the desired resonance frequency by means of the conventional mechanical working steps and therefore it is standard practice to individually adjust the resonance frequency of each vibrator by selectively cutting off end portions of the tuning fork tines in order to achieve the desired resonance frequency. This additional cutting off step is both time consuming and costly and reduces the production efficiency.

After formation of the quartz crystal tuning fork vibrator, it is necessary to attach electrodes to the tuning fork arms or tines to enable excitation of the vibrator. To this end, the technique used to form electrodes by photo-etching operations used in integrated circuit technology has been adopted to form electrodes on the turning fork vibrator. The formation of electrodes in this manner is desirable in that many sets of electrodes can be applied to many quartz crystal tuning fork vibrators during one operation thereby greatly reducing the manufacturing costs. However, in order to form the electrodes by photo-etching operations, it is necessary that the sheet of quartz crystal material forming the tuning fork vibrators by very thin, generally on the order of $50\mu$-$100\mu$. Tuning fork vibrators of this thickness, which is considerably less than the thickness of vibrators currently in use, then to undergo vibration at larger amplitudes than vibrators which are thicker and this is disadvantageous in that the long-term reliability and life of a tuning fork vibrator is largely affected by the magnitude or amplitude of the end point vibration of the tuning fork tines. The present invention resolves this problem by providing a quartz crystal tuning fork vibrator which operates at its resonance frequency with a lower amplitude of end point vibration of the tuning fork tines thereby extending the life and long-term reliability of the vibrator.

SUMMARY OF THE INVENTION

It is therefore a primary object of the present invention to provide a quartz crystal tuning fork vibrator of superior long-term reliability and which exhibits good performance throughout its useful life.

Another object of the invention is to provide a quartz crystal tuning fork vibrator capable of being massproduced at low cost.

A further object of the invention is to provide a quartz crystal tuning fork vibrator whose tuning fork tines undergo end point vibration at a lower amplitude then has heretofore been achieved in the prior art thereby extending the useful life and reliability of the vibrator.

A still further object of the present invention is to provide a quartz crystal tuning fork vibrator having a unique electrode pattern adhered thereto for exciting the vibrator to undergo flexural vibration in its resonance mode such that all of the flexural strain is confined to the outside portions of the tuning fork tines thereby lowering the amplitude of vibration of the tine ends.

The above and other objects, features and advantages of the invention are accomplished by a quartz crystal tuning fork vibrator composed of a monolithic quartz crystal vibrator having a tuning fork shape and including a plurality of vibratable tines. A set of electrodes are adhered to opposite surfaces of the tuning fork vibrator and are arranged in such a manner than when suitable voltage is applied thereto, the tines undergo flexural vibration in the fundamental or resonance mode. The electrodes on each tine surface are preferably arranged in groups of four with the center two being applied with voltage of one polarity at the time when the outer two are applied with voltage of the other polarity so that no electric field is established at the center of the tines and instead, all of the flexural strain is confined to the outside portions of the tines thereby lowering the amplitude of vibration of the tine ends to the order of $5\mu$–$10\mu$.

Having in mind the above and other objects, features and advantages of the invention that will be evident from an understanding of this disclosure, the present invention comprises a quartz crystal tuning fork vibrator as illustrated in the presently preferred embodiments of the invention which are hereinafter set forth in sufficient detail to enable those persons skilled in the art to clearly understand the function, operation and advantages of it when read in conjunction with the accompanying drawings.

DETAILED DESCRIPTION OF PREFERRED EMBODIMENTS

Figure 1:
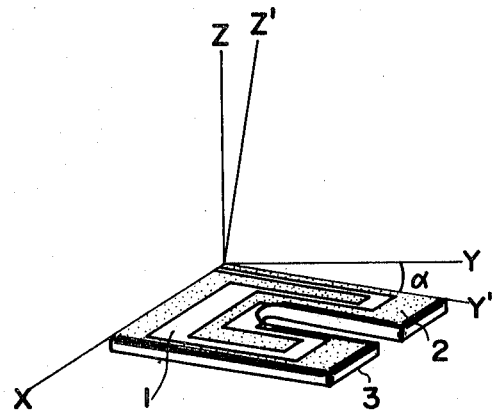
FIG. 1 is an explanatory view of a conventional type quartz crystal tuning fork vibrator.
Figure 2:
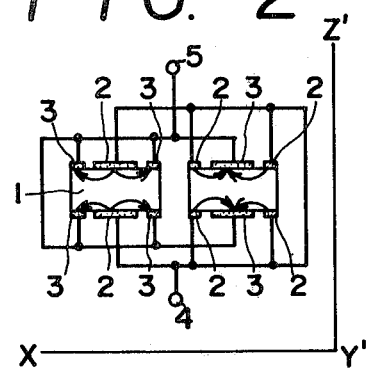
FIG. 2 is a cross-sectional view of the vibrator shown in FIG. 1 showing the electrode pattern of the vibrator.

The conventional quartz crystal tuning fork vibrator of the prior art is shown in FIGS. 1-2 and comprises a quartz crystal vibrator 1 configured in the shape of a tuning fork having two vibratable tines. The vibrator is shown orientated along the x,y and z axes which comprise, respectively, the electrical, mechanical and optical axes of the quartz crystal tuning fork vibrator. As shown, the vibrator is composed of a Z-plate turned at an angle $\alpha$ about the x axis to define new y and z axes of the vibrator which are shifted the angle $\alpha$ and are designated as y' and z' axes. As known in the art, the angle of rotation $\alpha$ is generally selected in the range of 0°-10°.

An electrode pattern is applied to opposite sides of the major surfaces of the vibrator 1 and as shown in FIGS. 1-2, the electrode pattern comprises electrodes 2 and 3. The electrodes 2 and 3 are divided into three pieces along the length of the tines as depicted in the cross-sectional view of FIG. 2. The electrode 2 is connected through suitable conductors to a terminal 4 whereas the electrode 3 is connected through conductors to a terminal 5. During operation, an alternating voltage is applied across the terminals 4 and 5 to effect flexural vibration of the tuning fork tines. For example, when a positive potential is applied to the terminal 4 and a negative potential to the terminal 5, an electric field is established within the quartz crystal material and the field acts from the electrode 2 to the electrode 3 as shown by the arrows in FIG. 2. Under this condition, the left turning fork tine in FIG. 2 undergoes tensile strain and the right tuning fork tine undergoes compressive strain thereby imparting flexural motion to the tines. By suitably alternating the potentials applied to the terminals 4 and 5, the flexural vibrations are sustained.

According to measured test results, a quartz crystal tuning fork vibrator of the type shown in FIGS. 1 and 2 and having tuning fork tines of length=3.0 mm., width=0.3 mm. and thickness=0.05 mm. and a 0 cutting angle, i.e. $\alpha=0$, was driven by a C-Mos integrated circuit of a watch by a power source of 1.57 volts. The amplitude of the vibrations of the tine ends was measured and found to be in the range of $15\mu$-$20\mu$ during measured vibration of the tuning fork vibrator in its resonance mode. These relatively large amplitudes of vibration are due to the large strains created within the quartz crystal material by virtue of the fact that the excitation electrodes 2 and 3 create electric fields throughout substantially the entire body of the tuning fork tines.

Figure 3:
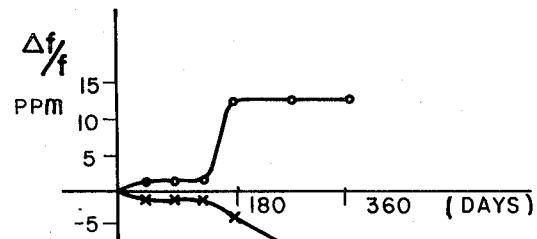
FIG. 3 is a plot showing the aging characteristics of the conventional quartz crystal tuning fork vibrator.

As mentioned above, one drawback of large amplitude end point vibrations is that such tend to shorten the useful life of the vibrator and lead to fatigue and/or hysteresis (non-linearity of response). These drawbacks are shown in FIG. 3 which shows the aging characteristics of the conventional prior art type quartz crystal tuning fork vibrator and from which can be seen that the change in frequency with respect to the desired resonance frequency is very stable at the beginning, but suddenly undergoes a drastic change and thereafter either remains in a stable condition or ceases to vibrate. These undesirable aging characteristics are principally due to the large amplitudes of vibration of the tuning fork tine ends.

Figure 4:
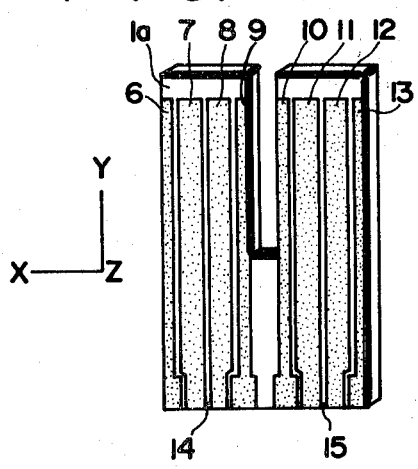
FIG. 4 is a perspective view of a quartz crystal tuning fork vibrator according to the invention as viewed from a point along the z axis.
Figure 5:
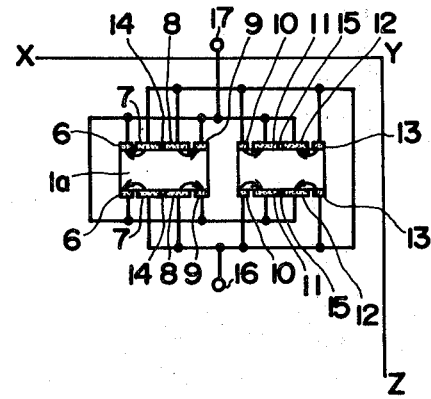
FIG. 5 is a cross-sectional view of the vibrator shown in FIG. 4 showing the electrode pattern of the vibrator.

One embodiment of quartz crystal tuning fork vibrator according to the present invention is shown in FIGS. 4-5. The vibrator comprises a quartz crystal vibrator $1a$ in the shape of a tuning fork having two vibratable tines or arms. The vibrator comprises a Z-plate and in this embodiment, the cutting angle $\alpha$ is 0. An electrode pattern is applied on opposite sides of the major surfaces of the vibrator and the pattern comprises four individual electrodes or electrode segments 6,7, 8 and 9 extending along the length of one tuning fork tine and four individual electrodes or electrode segments 10, 11, 12 and 13 extending along the length of the other tuning fork tine. Similar sets of four electrodes each are applied to the reverse surface of the vibrator. As seen in FIG. 4, the center two electrodes 7,8 and 11,12 of both tines are separated throughout their length by slots 14 and 15. In addition, the electrodes 6-13 do not extend to the end tips of the tine ends and instead, terminate short of the end tips. These features are contrary to those found in prior art quartz crystal tuning fork vibrators such as the type shown in FIGS. 1-2.

Voltage applying means in the form of terminals 16 and 17 and associated conductors are connected to the electrode pattern for applying voltage thereto to develop electric fields within the quartz crystal material to excite the vibrator into vibration in its resonance mode. The conductors connect the two center electrodes 7 and 8 of the first group and the two outer electrodes 10 and 13 of the second group to the terminal 16 and in a similar manner, connect the two outer electrodes 6 and 9 of the first group and the two inner electrodes 11 and 12 of the second group to the other terminal 17. The electrode groups disposed on each major surface of the vibrator are connected in this fashion.

During operation of the quartz crystal tuning fork vibrator of FIGS. 4 and 5 and assuming that the terminal 16 is connected to a source of positive potential and the terminal 17 connected to a source of negative potential, the vibrator will be biased so as to establish electric fields within the quartz crystal material in the directions of the arrows indicated in FIG. 5. Thus, electric fields are established in the left tuning fork tine and the fields act from the center electrodes 7 and 8 outwardly to the respective outer electrodes 6 and 9 thereby placing the tine in tensile strain. At the same time, and in the reverse manner, electric fields are established in the right tuning fork tine and the fields act from the outer electrodes 10 and 13 inwardly towards the respective center electrodes 11 and 12 thereby placing the right tine in compressive strain. By virtue of the slots 14 and 15 and by virtue of the fact that the two center electrodes within each group are always maintained at the same potential, no electric field is ever established at the center of the tines throughout their entire length. By such a construction, the vibratable tines undergo flexural strain at their outside portions only and do not undergo strain at their center portions. Consequently, the resultant amplitudes of vibration of the tine ends are considerably lower than those of conventional quartz crystal tuning fork vibrators and are on the order of 5μ–10μ as compared to the prior art range of 15μ–20μ. Thus the excitation electrodes 6–13 are arranged so that no electric field is created at the center of the tines and instead, all of the flexural strain is confined to the outside portions of the tines thereby lowering the amplitude of vibration of the tine ends.

The construction of the invention is also advantageous in that the crystal impedance of the quartz crystal tuning fork vibrator is not affected as such is determined essentially by the strains occurring at the outside portions of the vibratable tines. Therefore, the vibrator of the invention can achieve a reduction in the amplitude of the end point vibration of the tuning fork tines without any deterioration of the crystal impedance.

Figure 6:
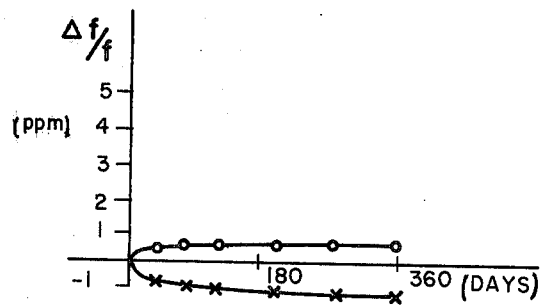
FIG. 6 is a plot of the aging characteristics of the quartz crystal tuning fork vibrator of the invention.

The aging characteristics of the present quartz crystal tuning fork vibrator are graphically shown in FIG. 6 which comprises a plot of the change in frequency with respect to the desired resonance frequency verses time. The plot was obtained using a vibrator of the type shown in FIGS. 4 and 5 driven by a C-MOS integrated circuit of a watch by a power source of 1.57 volts. As can be readily seen, the vibrator exhibits very stable aging characteristics with virtually no frequency shifts throughout its useful life.

Figure 7:
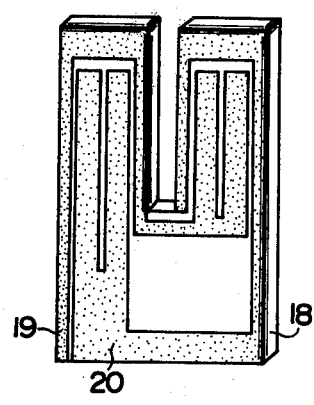
FIG. 7 is a perspective view of another embodiment of quartz tuning fork vibrator according to the invention.

FIG. 7 shows another embodiment of quartz crystal tuning fork vibrator according to the present invention and more particularly, shows another embodiment of electrode pattern. In this embodiment, a quartz crystal tuning fork vibrator 18 has applied to each of its major surfaces an electrode pattern consisting of electrodes 19 and 20. The electrode 19 comprises the two outer electrodes or electrode segments of the left tine and the two center electrodes or electrode segments of the right tine whereas the electrode 20 comprises the two center electrodes of the left tine and the two outer electrodes of the right tine. A similar set of electrodes is applied to the back surface of the vibrator 18 which is not visible in FIG. 7. In this embodiment, the inner two electrode segments of each tine are also interconnected at their ends by an end electrode segment (not numbered) disposed proximate the tine free end and extending widthwise of the tine.

Figure 8:
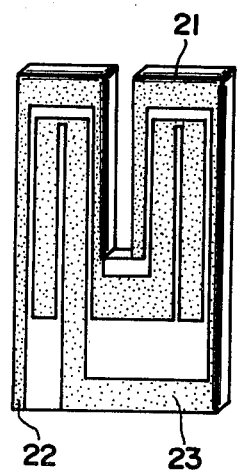
FIG. 8 is a perspective view of a further embodiment of quartz crystal tuning fork vibrator according to the invention.

FIG. 8 shows another embodiment of quartz crystal tuning fork vibrator according to the invention and which comprises a vibrator 21 having affixed to each of its two major surfaces electrodes 22 and 23. The electrode 22 comprises the two outer electrodes or electrode segments of the left tine and the two center electrodes or electrode segments of the right tine whereas the electrode 23 forms the two center electrodes of the left tine and the two outer electrodes of the right tine. The operating principles of the embodiment shown in FIGS. 7 and 8 are similar to that described above with respect to the embodiment of FIGS. 4–5. In this embodiment, the inner two electrode segments of each tine are also interconnected at their ends by an end electrode segment (not numbered) disposed proximate the tine free end and extending widthwise of the tine.

Figure 9:
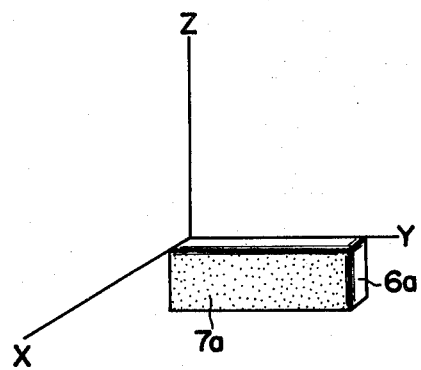
FIGS. 9 and 10 are explanatory views for explaining the basic mode of operation of a quartz crystal vibrator, FIG. 9 being a perspective view of a quartz crystal plate composed of an X-plate and FIG. 10 being a cross-sectional view thereof.
Figure 10:
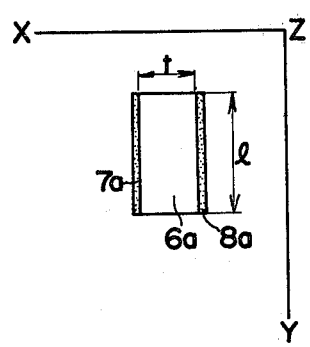

FIGS. 9 and 10 are useful in explaining the basic mode of operation of a quartz crystal vibrator. As shown, a quartz crystal 6a is cut as an X-plate and has electrodes 7a and 8a disposed at its two opposite major surfaces. The plate has a length dimension l along the y axis and a thickness dimension t along the x axis. When a voltage V is applied across the electrodes such that the electrodes 7a is at a positive potential and the electrode 8a is at a negative potential, the quartz crystal plate undergoes strain and extends an amount δl in the y direction and contracts an amount δt in the x direction due to the so-called converse piezoelectric effect, i.e., the mechanical strain produced in the quartz crystal by virtue of the applied electric stress. The amount of extension and contraction can be found by the following relationships:

$$\delta l = 2.15 \times 10^{-12} Vl/t \text{ [meters]} \tag{1}$$

$$\delta t = 2.15 \times 10^{-12} V \text{ [meters]} \tag{2}$$

Figure 11:
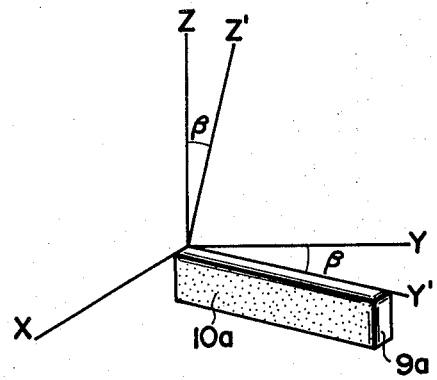
FIGS. 11 and 12 are explanatory views, FIG. 11 being a perspective view of a quartz crystal plate composed of an X-plate turned through an angle $\beta$ about the x axis and FIG. 12 being a cross-sectional view thereof.
Figure 12:
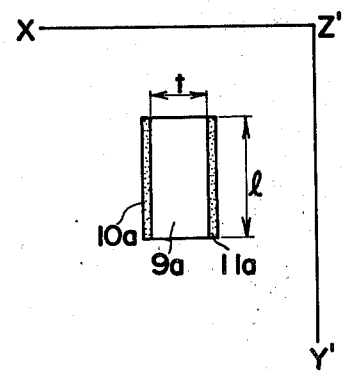

FIGS. 11 and 12 are explanatory views similar to FIGS. 9 and 10, respectively, though indicating the relationships obtained when the quartz crystal plate is turned through an angle β about the x axis. A quartz crystal plate 9a is comprised of an X-plate having electrodes 10a and 11a adhered to opposite ones of its major surfaces. In this case, however, the X-plate is turned through an angle β about the x axis thereby shifting the y and z axes to new y' and z' axes. Assuming that the quartz crystal plate 9a has the same length and thickness directions and is biased in the same manner as the plate 6a, the plate 9a will undergo extension in the y' direction by an amount δl' and contraction in the x direction an amount δt' according to the following relationships:

$$\delta l' = 2.15 \times 10^{-12} Vl/t \cos^2 \beta \text{ [meters]} \tag{3}$$

$$\delta t' = 2.15 \times 10^{-12} V \text{ [meters]} \tag{4}$$

From equation 3, it can be seen that the extent of strain in the length direction can be controlled by suitably selecting the angle β as the strain in the direction of the y' axis is proportional to the value of $\cos^2 \beta$. In accordance with tests conducted on a quartz crystal tuning fork vibrator according to the principles of the invention, the amplitude of the end point vibration of the tines was maintained below 10μ by selecting the angle β within the range 10°–45°. It is also possible to form a quartz crystal tuning fork vibrator having a thickness less than 0.3 mm. by selecting the cutting angle β within this range and such a vibrator possesses stable aging characteristics.

Figure 13:
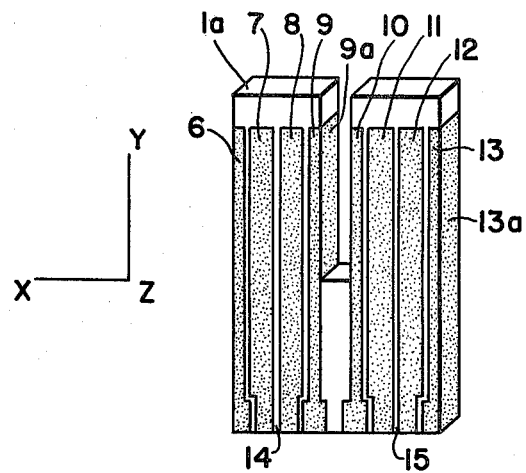
FIG. 13 is a perspective view of another embodiment of quartz crystal tuning fork vibrator according to the present invention as viewed along the z axis.
Figure 14:
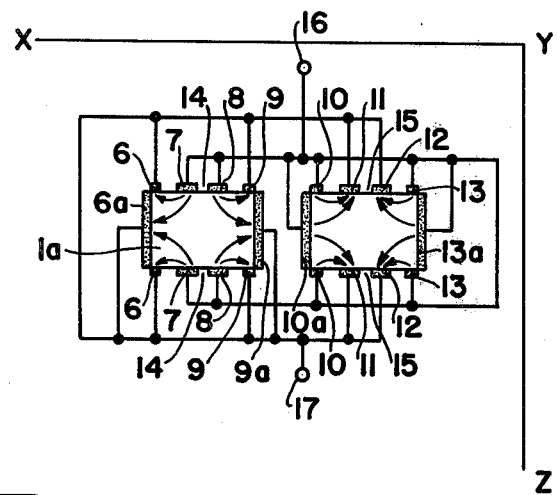
FIG. 14 is a cross-sectional view of the vibrator shown in FIG. 13 showing the electrode pattern of the vibrator.

A further embodiment of quartz crystal tuning fork vibrator according to the invention is shown in FIGS. 13–14 and this embodiment is similar to that shown in FIGS. 4–5 and therefore the same reference characters have been used to denote the same parts in both embodiments and in order to avoid repetition, only the differences between the two will be discussed. In this embodiment, the side portions of each tine are provided with electrodes side or side electrode segments which are connected so as to be maintained at the same polarity as their adjoining outer electrodes. Thus side electrodes 6a, 9a, 10a and 13a are adhered to the respective sides of the tines and are connected through suitable conductors so as to be maintained at the same polarity as their adjoining outer electrodes. The principle of operation is the same as that described above with reference to FIGS. 4–5 and the presence of the side electrodes functions to increase the magnitude of the electric fields within the tines in the x axis direction as compared to the magnitude of the fields when no side electrodes are present. It is noted, however, that no electric fields are developed at the center portion of the tines and accordingly no strain occurs at the tine center portions so that the amplitude of the end point vibrations of the tines is maintained on the order of $5\mu$–$10\mu$.

Figure 15:
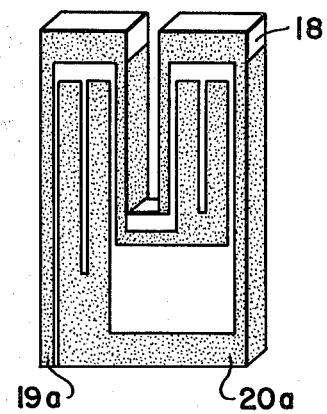
FIG. 15 is a perspective view of another embodiment of quartz crystal tuning fork vibrator according to the present invention.

The embodiment shown in FIG. 15 is similar to that shown in FIG. 7 except that the quartz crystal tuning fork vibrator 18 is provided with side electrodes in a manner similar to that shown in FIG. 13. More particularly, an electrode 19a comprises the two outer electrodes and corresponding side electrodes of the left tine and the two center electrodes of the right tine whereas an electrode 20a comprises the two outer electrodes and corresponding side electrodes of the right tine and the two center electrodes of the left tine. In all other respects, the vibrator is similar to that of FIG. 7.

While the invention has been disclosed with reference to several preferred embodiments thereof, it is understood that many modifications thereof and changes thereto will become apparent to those ordinarily skilled in the art, and the present invention is intended to cover all such modifications and changes which fall within the spirit and scope of the invention as defined in the appended claims.

What I claim is:

1. A quartz crystal tuning fork vibrator comprising: a quartz crystal vibrator having a tuning fork shape including a pair of vibratable tines each having opposite major planar surfaces; and means for establishing alternating electric fields within said tines except in the vicinity of the tine central portions to thereby excite said tines into flexural vibration at lower amplitudes of vibration of the tine ends than would otherwise occur if the said electric fields were also established in the vicinity of said tine central portions, said means comprising four electrode segments disposed on at least one of said major planar surfaces of each tine and extending lengthwise therealong to define two inner electrode segments disposed between two outer electrode segments, means electrically connecting the two outer electrode segments of one tine with the two inner electrode segments of the other tine, and means electrically connecting the two inner electrode segments of said one tine with the two outer electrode segments of said other tine.

2. A quartz crystal tuning fork vibrator according to claim 1; wherein said quartz crystal vibrator comprises a Z-plate rotated 10° to 45° around the X-axis.

3. A quartz crystal tuning fork vibrator according to claim 1; wherein said means for establishing alternating electric fields within said tines comprises four electrode segments disposed on both opposite major planar surfaces of each tine, and wherein the four electrode segments on both surfaces of each tine are electrically connected in the same manner to the electrode segments of the other tine.

4. A quartz crystal tuning fork vibrator according to claim 1; wherein said means for establishing alternating electric fields within said tines further comprises side electrode segments disposed on the side surfaces between said opposite major planar surfaces of each tine and extending lengthwise therealong, means electrically connecting the side electrode segments of said one tine with said two inner electrode segments of said other tine, and means electrically connecting the side electrode segments of said other tine with said two inner electrode segments of said one tine.

5. A quartz crystal tuning fork vibrator according to claim 4; wherein said means for establishing alternating electric fields within said tines includes means for effecting flexural vibration of said tines at amplitudes of vibration of the tine ends within the range $5\mu$ to $10\mu$.

6. A quartz crystal tuning fork vibrator according to claim 4; wherein said means for establishing alternating electric fields within said tines includes means for effecting flexural vibration of said tines at amplitudes of vibration of the tine ends no greater than $10\mu$.

7. A quartz crystal tuning fork vibrator according to claim 6; wherein said quartz crystal vibrator comprises a Z-plate rotated 10° to 45° around the X-axis.

8. A quartz crystal tuning fork vibrator according to claim 1; wherein said means for establishing alternating electric fields within said tines includes means for effecting flexural vibration of said tines at amplitudes of vibration of the tine ends within the range $5\mu$ to $10\mu$.

9. A quartz crystal tuning fork vibrator according to claim 1; wherein said means for establishing alternating electric fields within said tines includes means for effecting flexural vibration of said tines at amplitudes of vibration of the tine ends no greater than $10\mu$.

10. A quartz crystal tuning fork vibrator according to claim 1; further including end electrode segments disposed at the free end of each tine and interconnecting the ends of the two outer electrode segments.

11. A quartz crystal tuning fork vibrator according to claim 1; further including end electrode segments disposed proximate the free end of each tine and interconnecting the ends of the two inner electrode segments.

12. A quartz crystal tuning fork vibrator comprising: a quartz crystal vibrator having a tuning fork shape including a pair of vibratable tines; and voltage applying means for applying alternating voltage to said vibrator in such a manner to establish widthwise directed alternating electric fields within said tines at the outside portions thereof and not at the tine centers so as to excite said tines into flexural strain at their outside portions only and not at their center portions thereby effecting flexural vibration of said tines at amplitudes of vibration of the tine ends no greater than $10\mu$.

13. A quartz crystal tuning fork vibrator according to claim 12; wherein said voltage applying means includes means for effecting flexural vibration of said tines at amplitudes of vibration of the tine ends within the range $5\mu$–$10\mu$.

14. A quartz crystal tuning fork vibrator according to claim 12; wherein said voltage applying means comprises a group of electrodes disposed on opposite major surfaces of each tine, each group comprising two outer electrodes extending lengthwise along the tine at the respective outer portions of the tine surface, and two center electrodes extending lengthwise along the tine at the central portion of the tine surface, and means connecting the two outer electrodes of both groups of electrodes of one tine and the two center electrodes of both groups of electrodes of the other tine to one terminal and connecting the two center electrodes of both groups of electrodes of said one tine and the two outer electrodes of both groups of electrodes of said other tine to another terminal whereby an alternating voltage applied across said terminals effects flexural vibration of said tines.

15. A quartz crystal tuning fork vibrator according to claim 14; further including side electrodes each disposed on a side surface of said tines and extending lengthwise along the tine, and means connecting each side electrode to the same terminal to which are connected the outer electrodes which adjoin said side electrode.

16. A quartz crystal tuning fork vibrator according to claim 14; wherein said voltage applying means includes means for effecting flexural vibration of said tines at amplitudes of vibration of the tine ends no greater than 10μ.

17. A quartz crystal tuning fork vibrator according to claim 14; wherein said voltage applying means includes means for effecting flexural vibration of said tines at amplitudes of vibration of the tine ends within the range 5μ–10μ.

18. A quartz crystal tuning fork vibrator according to claim 12; wherein said quartz crystal vibrator comprises a z-plate having a cutting angle of 10°–45° about the x axis.

* * * * *